(12) United States Patent
Aliane et al.

(10) Patent No.: US 12,094,912 B2
(45) Date of Patent: Sep. 17, 2024

(54) ELECTROMAGNETIC RADIATION DETECTION STRUCTURE WITH OPTIMISED ABSORPTION AND METHOD FOR FORMING SUCH A STRUCTURE

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Jean-Louis Ouvrier-Buffet, Grenoble (FR); Claire Vialle, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 727 days.

(21) Appl. No.: 17/296,033

(22) PCT Filed: Nov. 21, 2019

(86) PCT No.: PCT/FR2019/052776
§ 371 (c)(1),
(2) Date: May 21, 2021

(87) PCT Pub. No.: WO2020/109704
PCT Pub. Date: Jun. 4, 2020

(65) Prior Publication Data
US 2022/0013573 A1 Jan. 13, 2022

(30) Foreign Application Priority Data
Nov. 28, 2018 (FR) ...................................... 18 72024

(51) Int. Cl.
*H01L 27/00* (2006.01)
*G01J 5/08* (2022.01)
(Continued)

(52) U.S. Cl.
CPC ...... *H01L 27/14669* (2013.01); *G01J 5/0853* (2013.01); *G01J 5/20* (2013.01); *H01L 27/14689* (2013.01)

(58) Field of Classification Search
CPC ..... G01J 5/0853; G01J 5/20; H01L 27/14689; H01L 27/14669; B81B 2201/0207; B81B 2201/0278; B81B 2207/015
See application file for complete search history.

(56) References Cited

U.S. PATENT DOCUMENTS 9,667,121 B2 5/2017 Aliane et al.
10,145,812 B2 12/2018 Aliane et al.
(Continued)

FOREIGN PATENT DOCUMENTS

WO WO 2018/055276 A1 3/2018

OTHER PUBLICATIONS

U.S. Appl. No. 14/617,042, filed Feb. 9, 2015, US 2015/0226612 A1, Palanchoke, U., et al.
(Continued)

*Primary Examiner* — Reema Patel
(74) *Attorney, Agent, or Firm* — Oblon, McClelland, Maier & Neustadt, L.L.P.

(57) ABSTRACT

The invention concerns an electromagnetic radiation detection structure (10) comprising at least one absorbing element defining an absorption plane, and a MOSFET transistor (100). The transistor comprises: at least one first and at least one second zone (111, 112) of a first type of conductivity; at least one third zone (113) separating the first and second zones (111, 112) from each other; and a gate electrode. The first zone (111), the third zone (113) and the second zone (112) are formed respectively by a first, a third and a second layer that extend in the absorption plane parallel to each other and are arranged one after another in a direction (Continued)

perpendicular to the absorption plane. The gate electrode covers the third zone (113) along at least one lateral wall of said third zone (113).

13 Claims, 16 Drawing Sheets

(51) Int. Cl.
*G01J 5/20* (2006.01)
*H01L 27/146* (2006.01)

(56) References Cited

U.S. PATENT DOCUMENTS

| | | |
|---|---|---|
| 10,498,259 B2 | 12/2019 | Aliane |
| 2015/0153236 A1 | 6/2015 | Yagami |
| 2019/0271598 A1 | 9/2019 | Yon et al. |

OTHER PUBLICATIONS

International Search Report issued Apr. 3, 2020 in PCT/FR2019/052776 filed Nov. 21, 2019, 2 pages.
Preliminary French Search Report issued Oct. 18, 2019 in French Patent Application No. 1872024 filed Nov. 29, 2018, 2 pages (with Translation of Category).
Gitelman, L., et al., "CMOS-SOI-MEMS Transistor for Uncooled IR Imaging", IEEE Transactions on Electron Devices, vol. 56, No. 9, 2009, pp. 1935-1942.
U.S. Appl. No. 17/312,616, filed Jun. 10, 2021, Abdelkader Aliane.

ELECTROMAGNETIC RADIATION DETECTION STRUCTURE WITH OPTIMISED ABSORPTION AND METHOD FOR FORMING SUCH A STRUCTURE

This invention results from a contract awarded by the French Ministry of Defence, which has certain rights in the invention.

TECHNICAL FIELD

The invention relates to structures for detecting electromagnetic radiation, especially in the infrared range.

More precisely, the invention relates to a structure for detecting electromagnetic radiation and a method for manufacturing such a structure.

TECHNICAL FIELD

In order to detect electromagnetic radiations, especially in the infrared wavelength range, it is known to use electromagnetic radiation detection structures of the bolometer type.

Such a structure includes:
an absorbing element configured to absorb the electromagnetic radiation, generally provided in the form of a suspended membrane,
a transducer having a characteristic which varies with temperature, the transducer being associated with the absorbing element for detecting temperature rise of said absorbing element upon absorbing the electromagnetic radiation.

In order to allow a reduction in the size of these structures, the use of MOS-FET transistors as transducers has recently been suggested.

In accordance with document WO2018055276 A1, the transistor of a structure according to such a possibility includes:
at least one first and one second zone of a first conductivity type,
at least one third zone separating the first and second zones from each other, the third zone being of a second conductivity type opposite to the first conductivity type with a lower concentration of majority carriers than the first and second zones,
at least one first gate electrode arranged to bias the third zone.

At least one metallisation of such a transistor, especially the gate electrode, forms the absorbing element of the detection structure.

In this configuration, in accordance with FIG. 1B of WO2018055276 A1, the first, third and fourth zones follow one another along the absorption plane in order to form the drain, channel and source of the CMOS transistor, respectively.

If a detection structure according to this possibility described in document WO2018055276 A1 provides good absorption of the electromagnetic radiation to be detected, especially by optimising the absorbing element, this absorption is still not optimal.

Indeed, if, in accordance with its teaching, it is possible to provide an absorbing element with an impedance close to that of vacuum, that is in the order of 376.9Ω, the total impedance of the structure, which is that perceived by the electromagnetic wave to be absorbed, is in reality lower and therefore does not enable optimal absorption to be obtained. Indeed this impedance involves, in addition to the absorbing element, all the elements of the transistor, especially the first and second zones, which are highly doped to enable good electrical contact and have silicidisation, not shown in this document WO2018055276 A1, at these zones can drastically reduce the impedance. Therefore the equivalent resistance perceived by the electromagnetic radiation is generally between 1 and 100Ω/□, which is relatively far from the 376.9Ω/□ that would be necessary to optimise the absorption of electromagnetic radiation by the absorbing element.

DISCLOSURE OF THE INVENTION

The invention aims at overcoming this drawback and its purpose is thus to provide a detection structure which includes a MOS-FET transistor as a transducer and which is likely to have a higher absorption rate than a structure of prior art.

To this end, the invention relates to a detection structure of the bolometer type for detecting an electromagnetic radiation, the detection structure including:
at least one absorbing element configured to absorb the electromagnetic radiation and extending substantially along an absorption plane,
a transistor of the MOS-FET type associated with the first absorbing element to detect the temperature rise of said absorbing element upon absorbing the electromagnetic radiation by the latter, the transistor including:
at least one first and one second zone of a first conductivity type,
at least one third zone separating the first and second zones from each other, the third zone being of a second conductivity type opposite to the first conductivity type with a lower concentration of majority carriers than the first and second zones,
a gate electrode.

The first zone, the third zone and the second zone are formed respectively by a first, a third and a second layer which extend along the absorption plane parallel to one another and which follow one another along a direction perpendicular to said absorption plane, each of said first, second and third zones having, relative to the thickness of the corresponding layer, at least one side wall.

It will be noted that in a conventional configuration of the invention the third zone has a concentration of majority carriers significantly lower than those of the first and second zones, that is lower than 10 times those of the first and second zones, or even 50 times or 100 times those of said first and second zones.

The gate electrode covers the third zone along at least one side wall of said third zone.

The inventors have noticed that in a structure such as that described in WO2018055276 A1, the doped zones, that are the first and second zones, play a major role in lowering the equivalent impedance perceived by the radiation. However, the configuration of the invention enables good control of the dimensions of the latter, since they are provided in the form of layers. Thus, the invention allows, by the possibility of a reduced thickness of the first and second zones to which it gives access, first and second zones to be provided, having a strongly reduced volume with respect to the structures of prior art and therefore with a reduced influence of the latter on the equivalent impedance perceived by the electromagnetic wave to be absorbed.

Moreover, such a configuration according to the invention enables the signal-to-noise ratio of the structure to be optimised. Indeed, the work of L. Gitelman and his co-authors published in 2009 in the scientific journal "IEEE transaction on electron devices" volume 56 number 9 pages 1935-1942, showed that the noise equivalent power, noted NEP in the context of this work, representing the inverse of the signal-to-noise ratio of such a transistor, varies inversely with the drain-source current and the absorption power.

However, if such a structure allows an optimisation of the absorption power, through the configuration of the first and second zones, it also allows an optimisation of the drain-source current which is directly dependent on the geometry of the transistor. Indeed, the drain-source current is proportional to the ratio W/L with W being the channel width and L the channel length. But in the configuration of the invention in which each of the zones is formed by a respective layer, the channel length L is equal to the thickness of the third zone. Thus, by means of an adapted geometry of the transistor, such as for example the first, second and third zones in annular form, which enables the channel width W to be optimised, it is possible to optimise the drain-source current by having a minimum channel length L provided by the configuration of the invention.

In this way, it is possible to obtain with a structure according to the invention an optimisation both of the absorption of electromagnetic radiation, by optimising the equivalent impedance of the absorbing element which it allows, and of the drain-source current, by optimising the channel length which it allows, with respect to a structure of prior art including a MOS-FET transistor as a transducer.

According to the general operating principle of a MOS-FET, the gate electrode is arranged to bias the third zone.

The third zone may have at least two sidewalls, with the gate electrode covering the third zone along at least two side walls of said third zone which are opposite to each other.

In this way, the channel is formed at each of the side walls. Thus, the channel width W is multiplied by two, since it is present on each of the side walls, and the ratio W/L is itself multiplied by two. The drain-source current is therefore optimised.

The absorbing element may comprise an absorption portion extending beyond a stack formed by the first, third and second zones.

The stack formed by the first, third and second zones may at least partially surround a zone of the so-called absorption structure, with the absorption portion extending at least partly parallel to the absorption zone.

In this way at said absorption zone, the stack formed by the first, third and second zones has little or no influence on the equivalent impedance of the absorbing element perceived by the electromagnetic radiation to be absorbed. Thus, it is easy to provide such an absorption portion with an equivalent impedance close to that of vacuum.

The gate electrode may include the absorbing element.

The gate electrode may comprise at least one layer made of a "mid-gap" metal for at least the third zone.

Such a "mid-gap" metal reduces the bias voltage of the gate and therefore the heat released by the transistor during operation. Since this residual heat of the transistor is reduced, it has little influence on the measurement of the temperature rise caused by the absorption of radiation by the absorbing element. This results in optimising the sensitivity of the structure according to the invention.

The layer made in a "mid-gap" metal can be supported by a dielectric layer, the metal of the "mid-gap" metal layer and the thicknesses of said layer and of the dielectric layer supporting it being selected so as to meet the following inequalities:

$$150 \ \Omega \leq \frac{\rho}{Ep} \leq 700 \ \Omega$$

with ρ the equivalent resistivity of said layers and Ep the sum of the thicknesses of said layers.

The transistor may further include a metal contact for the second zone.

The metal contact of the second zone may include the absorbing element.

It will be noted that the transistor may include a metal contact for the third zone. Alternatively, the third zone can be left at a floating potential.

The gate electrode can also cover the first zone and form a metal contact with the first zone.

The absorbing element may comprise a conductive layer supported by an insulating layer, the metal of the metal layer and the thicknesses of said metal layer and of the insulating layer supporting it being selected so as to meet the following inequalities:

$$150 \ \Omega \leq \frac{\rho}{Ep} \leq 700 \ \Omega$$

with ρ the equivalent resistivity of said layers and Ep the sum of the thicknesses of said layers.

In this way, the absorption of electromagnetic radiation by the absorbing element is optimised.

The invention further relates to a method for manufacturing a detection structure of the bolometer type for detecting an electromagnetic radiation, the manufacturing method comprising the following steps of:
  providing a second zone of a first conductivity type, said second zone extending along an absorption plane,
  forming a third zone in contact with the second zone, said second zone being of a second conductivity type opposite to the first conductivity type with a lower concentration of majority carriers than that of the second zone,
  forming a first zone in contact with the third layer, the first zone being of the first conductivity type with a higher concentration of majority carriers than that of the third zone, such that each of the first zone, second zone and third zone extends parallel to an absorption plane and the first, third and second zones follow one another along a direction perpendicular to said absorption plane, each of said first, second and third zones having, relative to the thickness of the corresponding layer, at least one side wall,
  forming a gate electrode covering the third zone along at least one side wall of said third zone so as to form a MOS-FET type transistor comprising the first, second and third zones and the gate electrode,
  The manufacturing method further comprising forming an absorbing element associated with the transistor such that the transistor is capable of detecting the temperature rise of said absorbing element upon absorbing the electromagnetic radiation, said absorbing element defining the absorption plane.

Such a method enables a structure according to the invention to be formed, which structure, as a result, has the advantages related thereto.

The steps of providing and forming the first, second and third zones may be concomitant, said providing and forming being achieved by etching a stack comprising a second, a third and a first layer.

In this way, the stack formed by the first, second and third zones has an etching flank particularly adapted to promote formation of the gate electrode.

The second zone can be provided prior to forming the third and first zones, the third zone being formed by selective deposition on at least one portion of the second zone and the first zone being formed by selective deposition on at least one portion of the third zone.

Thus, with such a method, the first, second and third zones do not have to be identical in width.

BRIEF DESCRIPTION OF THE DRAWINGS

The present invention will be better understood upon reading the description of examples of embodiment, given purely by way of indicating and in no way limiting purposes, with reference to the appended drawings in which.

Identical, similar or equivalent parts of the different figures bear the same reference numerals so as to facilitate switching from one figure to another. The different parts represented on the figures are not necessarily on a uniform scale, to make the figures more legible.

The various possibilities (alternatives and embodiments) should be understood as not being mutually exclusive and can be combined with each other.

DETAILED DISCLOSURE OF PARTICULAR EMBODIMENTS

Figure 1:
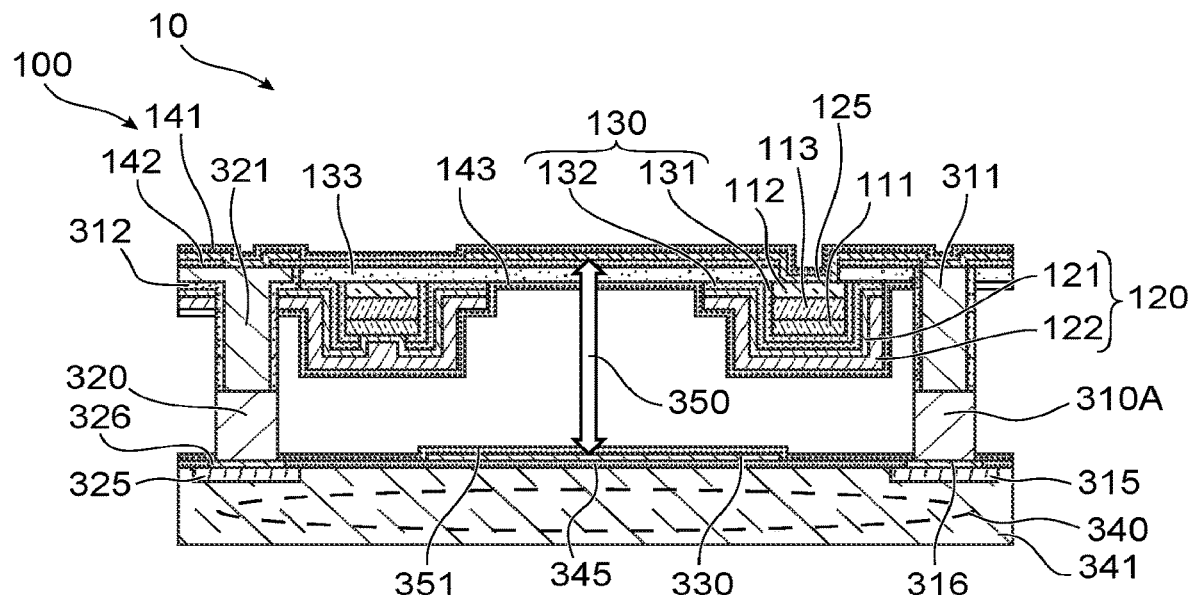
FIG. 1 illustrates, in a cross-sectional view, a detection structure according to the invention.

FIG. 1 schematically illustrates a detection structure 10 of the bolometer type according to the invention, such a detection structure 10 being suitable for detecting an electromagnetic radiation.

Such a detection structure 10 is particularly adapted for detecting an electromagnetic radiation in the infrared wavelength range. Thus, the different values indicated in the embodiments described below relate to this practical application, in which the wavelength range targeted is far infrared, that is between 8 and 12 μm. Of course, these values are only given as a non-limiting example, as the person skilled in the art is perfectly capable, from the present disclosure, of adapting these values to enable the optimised detection of electromagnetic radiation in a wavelength range other than the infrared range using such a detection structure 10.

Such a detection structure 10 includes:
a transistor 100 of the MOS-FET type associated with a first absorbing element to detect the temperature rise of said absorbing element upon absorbing the electromagnetic radiation by the latter, the transistor including:
at least one first and one second zone 111, 112 of a first conductivity type,
at least one third zone 113 separating the first and second zones 111, 112 from each other, the third zone 113 being of a second conductivity type opposite to the first conductivity type with a lower concentration of majority carriers than the first and second zones,
a gate oxide 130,
a gate electrode 120 comprising a first absorbing element 121, the gate electrode 120 further forming an ohmic contact of the first zone 111,
an ohmic contact 125 of the second zone 112 forming a second absorbing element,
a first and a second thermal insulation arm 310, 320 including respectively a first and a second conduction track 311, 321 to enable the transistor 100 to be biased, the first track 311 being connected to the second zone 112, the second track 321 being connected to the first zone 111 and the gate electrode 120 by short-circuiting them,
an optional reflective surface 330 arranged to form a quarter-wave cavity 350 with the second absorbing element,
a read-out circuit 340 only the substrate 341 of which is shown, the read-out circuit 340 being electrically connected to the first and second conduction tracks 311, 321 via first and second contact zones 315, 325 respectively.

In such a detection structure 10, the ohmic contact 125 of the second zone 112 extends, at least for its part forming respectively the first absorbing element, along a plane defining an absorption plane. It will be noted, in particular, that in FIG. 1, the absorption plane is defined by the part of ohmic contact 125 of the second zone 112, that is the second absorption element, extending along a zone of the structure surrounded by the stack formed by the first, second and third layers 111P, 112P, 113P, said zone being called the absorption zone.

It will be noted that, according to the practical application of the invention, structure 10 has side dimensions, that is along the directions in the absorption plane, of between 4 and 10 μm.

Figure 2A:
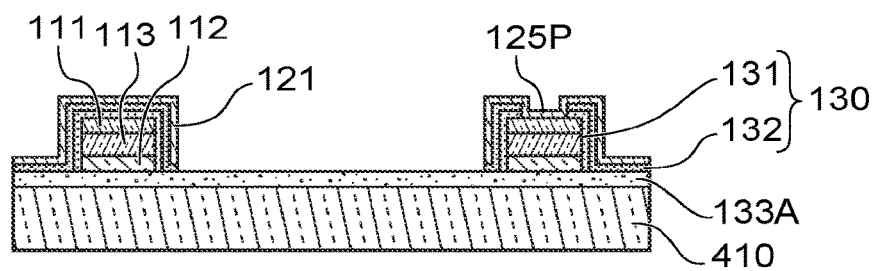
FIGS. 2A to 2B illustrate a MOS-FET transistor with a detection structure as shown in FIG. 1 before forming its gate and their metallisations in a cross-sectional view and a top view respectively.

According to the principle of the invention and, as illustrated in FIGS. 1 and 2A, the first zone 111, the third zone 113 and the second zone 112 are formed respectively by a first, a third and a second layer 111P, 112P, 113P which extend along the absorption plane parallel to one another and which follow one another relative to a direction perpendicular to said absorption plane, each of said first, second and third zones 111, 112, 113 having, relative to the thickness of the corresponding layer, at least one side wall.

Otherwise, each of the first layer, the second layer and the third layer 111P, 112P, 113P extends parallel to the absorption plane and the first layer 111P, the third layer 113P and the second layer 112P follow one another along a direction perpendicular to said absorption plane.

Each of the first, second and third layers 111P, 112P, 113P is a semiconductor layer, said first, second and third layers 111P, 112P, 113P preferably being made of single-crystal silicon Si.

According to a first possibility of the invention, the first and second layers 111P, 112P have a first conductivity type for which the majority carriers are electrons, or, in other words, the first and second layers 111P, 112P are N-doped. Alternatively and according to a second possibility of the invention, the first and second layers 111P, 112P may have a first conductivity type for which the majority carriers are holes, or, in other words, the first and second layers 111P, 112P are P-doped.

It will be noted that according to the practical application of the invention, the first and second layers 111p, 112P, 112P have N doping with a concentration of majority carriers of between $1 \cdot 10^{19}$ and $1 \cdot 10^{21}$ cm$^{-3}$. According to this same practical application of the invention, the thickness of said first and second layers 111p, 112P, 112P is between 10 and 200 nm, or even between 20 and 70 nm.

The third layer 113P can, according to the first possibility of the invention, have a second conductivity type opposite to the first conductivity type, that is a conductivity type in which the carriers are holes or, in other words, P doping. Likewise, according to the second possibility of the invention, the second conductivity type opposite to the first conductivity type, that is a conductivity type in which the majority carriers are electrons or, in other words, N doping.

According to the practical application, the third layer 113P has P doping with a concentration of majority carriers of between $1 \cdot 10^{14}$ and $1 \cdot 10^{17}$ cm$^{-3}$ or even between $5 \cdot 10^{14}$ and $5 \cdot 10^{15}$ cm$^{-3}$, said concentration being, however, lower than that of the first and second layers 111P, 112P. According to the same practical application, the thickness of the third layer 113P is between 10 and 500 nm, or even between 50 and 250 nm or between 75 and 150 nm.

Figure 2B:
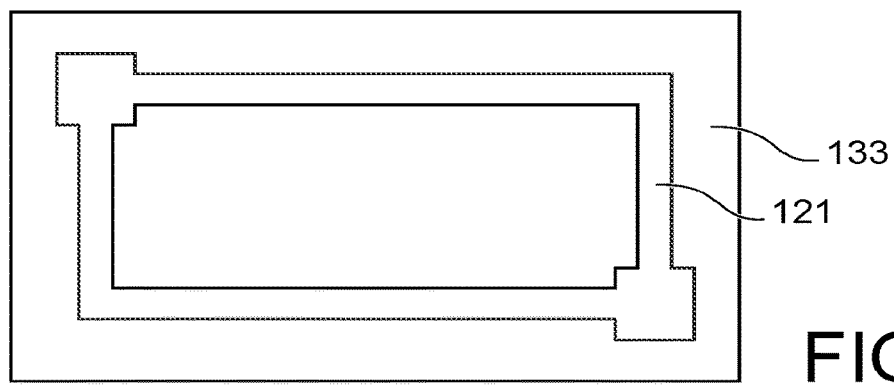

As illustrated in FIGS. 2A and 2B, a stack formed by the first, second and third layers 111P, 112P, 113P extends along a closed line which is, according to the possibility illustrated in FIG. 2B, rectangular. Such a shape is, of course, only provided as an example and said stack may, of course, extend in another shape, which may correspond to an open or closed line.

It will be noted, however, that preferably the stack formed by the first, second and third layers 111P, 112P, 113P is arranged to surround at least partly the zone of the detection structure which is called the detection zone. The parts of the gate electrode 120 and the ohmic contact 125 of the second zone 112 forming the first and second absorbing elements 121 extend at least partly along said detection zone. It will be noted that in this first embodiment only the second absorbing element extends entirely along the detection zone, the first absorbing element 121 having only minority portions extending along the detection zone.

According to this possibility, the stack formed by the first, second and third zones 111, 112, 113 can, for example, have:
a comb-like configuration, the surrounded absorption zones being the zones disposed between the arms of the comb, or
a serpentine-like configuration, the absorption zones surrounded being the zones defined between the bends of the serpentine.

The stack formed by the first, second and third zones 111, 112, 113 is, on the side walls of said zones and one face of the stack comprising the first zone 111, covered by at least one insulator 131, 132 forming, for the side walls of the third zone, a gate oxide 130.

In the present embodiment, the at least one insulator 131, 132 comprises a first insulating layer 131 of silicon dioxide and a second insulating layer 132 of a dielectric having a dielectric coefficient higher than that of silicon dioxide, this type of dielectric being generally known as high-K. Thus, the second insulating layer 132 can be, for example, a hafnium dioxide HfO$_2$ or an aluminium oxide such as alumina Al$_2$O$_3$.

The at least insulator layer 131, 132 covering the stack formed by the first, second and third zones 111, 112, 113, has at least one opening at the face of the stack which it covers to allow a contact to be made for the first zone 111. The at least insulator 131, 132 is covered by the gate electrode 120, said gate electrode 120 also forming the ohmic contact for the first zone 111.

It will be noted that, as illustrated in FIG. 2B, the stack may be wider at the openings. Thus, for example, according to the practical application of the invention, the stack may have a width of between 0.3 and 0.6 μm on the parts outside said contact-making openings and a width of between 0.5 and 0.8 μm on the parts corresponding to said openings.

According to this embodiment of the invention, the gate electrode 120 includes a first conductive layer 121 of titanium nitride TiN and a second conductive layer 122 of polycrystalline silicon pSi, the first conductive layer 121 covering the second insulating layer 132 and the second conductive layer 122 covering the first conductive layer 121.

According to the teaching of document WO2018055276 A1 and taking the configuration of the first absorbing element 121 into account, so as to promote the absorption capacities of the first absorbing element, the first conductive layer 121, the second insulator layer 132 and a third insulator layer 133 which supports it are selected so as to meet the following inequalities:

$$150 \ \Omega \leq \frac{\rho}{Ep} \leq 700 \ \Omega$$

with ρ the equivalent resistivity of the first conductive layer 121, the second insulator layer 132 and the third insulator layer 133 and Ep being the sum of the thickness of the first conductive layer 121, the second insulator layer 132 and the third insulator layer 133. It will be noted, that even more preferentially ρ/Ep is selected close to, or even equal to 376.9Ω.

Likewise, the material of the first conductive layer 121 is preferably a metal of the "mid-gap" type for the third zone 113. Thus, in the case where the third zone 113 is made of silicon, as is the case in this embodiment of the invention, the material of the first conductive layer is preferably a metal selected from the group including titanium nitrides TiN, tantalum nitrides TaN and molybdenum silicides MoSi$_2$.

By "mid-gap type metal", it is intended above and in the remainder of this document that the metal is selected so as to have, in the absence of bias of the structure, its Fermi energy in the band gap zone of the third zone 113 and more precisely in the vicinity of the mid-gap zone of the third zone 113, typically at an energy level distant from the mid-gap in a range between −25% and +25% of the band gap. Such a gate configuration is generally known by the those skilled in the art as "mid-gap". Thus in the case where the third zone is made of silicon, "mid-gap type metals" include especially titanium nitrides TiN, tantalum nitrides TaN and molybdenum silicides MoSi$_2$.

Thus in this embodiment of the invention, the first conductive layer 121 is preferably made of titanium nitride TiN and preferably includes a thickness between 5 and 15 nm or even equal to 10 nm.

The second conductive layer 122, in this embodiment of the invention, is made of polycrystalline silicon pSi with a thickness of between 10 and 100 nm, preferably equal to 50 nm.

In order to short-circuit the first zone 111 and the gate electrode 120, the first conductive layer 121 is in contact with the first zone 111 through at least one opening made in the at least one insulator 131, 132.

the stack is covered, on one of its faces comprising the second zone 112 and opposite the first zone 111, at least in part with a third conductive layer 125 forming the ohmic contact of the second zone 112.

According to the teaching of WO2018055276 A1 and likewise to the first absorbing element 121, so as to promote the absorption capacities of the second absorbing element formed by the third conductive layer 125, the third conductive layer 125, and the third insulator layer 133 which supports it are selected so as to meet the following inequalities:

$$150 \, \Omega \leq \frac{\rho}{Ep} \leq 700 \, \Omega$$

with $\rho$ the equivalent resistivity of the first conductive layer 121, the second insulator layer 132 and the third insulator layer 133 and Ep being the sum of the thickness of the first conductive layer 121, the second insulator layer 132 and the third insulator layer 133. It will be noted, that even more preferentially p/Ep is selected close to, or even equal to 376.9$\Omega$.

Thus, according to this embodiment of the invention, the third conductive layer 125 is made of titanium nitride TiN and has a thickness of between 5 and 15 nm and preferably equal to 10 nm.

It will be noted that, due to the preferred manufacturing method of the invention, in this first embodiment, each of the second conductive layer 122 and the third conductive layer 125 is coated on its surface opposite the stack, with respectively a first protective layer 143 and a second protective layer 141, such as a layer of aluminium nitride AlN, hafnium dioxide HfO2 or sapphire $Al_2O_3$, capable of protecting said conductive layers 122, 125 during an acid attack such as a hydrofluoric acid HF attack. Each of the first and second protective layers 143, 141 has a thickness of between 10 and 50 nm and preferably equal to 25 nm.

For the same reasons, and as shown in FIG. 1, a third insulator layer 133, which is used especially to insulate the first conduction track 311 from the second conduction track 321 and which is in contact with the second zone 112 by separating it, apart from the parts where they are in contact, from the third conductive layer 125, is coated with a third protective layer 142. Thus, as illustrated in FIG. 1, the third conductive layer is surrounded by the second and third protective layers 142, 141. Likewise as the first and second protective layers 143, 141, the third layer can be a layer of aluminium nitride AlN, hafnium dioxide $HfO_2$ or sapphire $Al_2O_3$, which is capable of protecting the third insulator layer 133 during an acid attack such as a hydrofluoric acid HF attack. The third protective layer 142 may have a thickness between 10 and 50 nm and preferably equal to 25 nm.

The structure includes, on either side of the stack, the first and second thermal insulation arms 310, 320 comprising respectively the first and second conduction tracks 311, 321 to enable transistor 100 to be biased. According to the possibility illustrated, each of the first and second thermal insulation arms 310, 320 extends along a direction perpendicular to the absorption plane.

The first and second thermal isolation arms 310, 320 are configured to hold transistor 100, and the absorption elements 121, 125 therein, away from substrate 410 including read-out circuit 340 while providing, through the first and second conduction tracks 311, 321, the electrical connection between transistor 100 and read-out circuit 340. In this way, the thermal contact between transistor 100 and read-out circuit 410 is reduced to a minimum. Detection structure 10 therefore has a relatively low thermal inertia with respect to its absorption elements and its sensitivity is preserved.

It will be noted that, according to a preferred possibility of the invention not illustrated in the figures, each of the first and second insulation arms including an insulating ribbon have a serpentine shape extending parallel to the absorption plane.

Each of the first and second thermal insulation arms 310, 320 includes a first portion, in contact with the gate electrode 120 and the ohmic contact 125 respectively. The first portion includes a first barrier layer 312, for example of titanium nitride TiN or a titanium/titanium nitride Ti/TiN bilayer, adapted to limit the risk of copper diffusion in the first and second zones 111, 112 and a copper body covered with said first barrier layer 312.

Each of the first and second thermal insulation arms 310, 320 further includes a second portion 310A, 320A extending the first portion of said thermal insulation arm 310, 320 towards the substrate. The second portion 310A, 320B, in this first embodiment, is made of copper.

Of course, as an alternative to the invention and in accordance with the teaching of document WO2018055276 A1, the first and second thermal insulation arms 310, 320 may have a configuration other than that for example described in said document.

Thus, according to a preferential, not depicted, possibility of the invention, each of the first and second insulation arms may comprise a respective insulating ribbon. According to this possibility, each insulating ribbon is configured with an optimised length without overlapping the quarter-wave cavity 350, said insulating ribbon having a first end in contact with a part of said insulation arm connecting the transistor 100 and a second end connecting the control circuit 200. Each insulating ribbon extends along an insulation plane parallel to the absorption plane and has a shape capable of providing an optimised length in order to optimise the thermal insulation of the transistor 100 with respect to the substrate 201. For example, each insulating ribbon can be zigzag or spiral shaped. Each insulating ribbon comprises: a metal core track, for example, made of titanium nitride TiN, and a passivation, stop coating, for example formed by a stack of a layer of amorphous silicon Sia, a layer of hafnium dioxide $HfO_2$ and a layer of alumina $Al_2O_3$. The insulation plane is preferably arranged between the transistor 100 and the control circuit. Alternatively, the insulation plane can be the same as the absorption plane.

Substrate 341 comprises the read-out circuit 340 and has first and second contacts of read-out circuit 315, 316, 325, 326 and a reflective surface 330 arranged to form with the second absorbing element 125 a quarter-wave cavity 350 adapted to the wavelength range of the radiation detected by detection structure 10. The reflective surface 330 is preferably formed from a material selected from the group including aluminium Al, copper Cu, gold Au, titanium Ti, platinum Pt, nickel Ni and alloys thereof, especially copper-aluminium alloy. The reflective surface 330 has a thickness of between 100 nm and 1 μm, this preferably being equal to 300 nm. It will be noted that substrate 410 also has a fourth insulating layer 345 covering a first face of the substrate and interposed between the substrate and the third insulating layer.

In an identical way to the second and third conductive layers 122, 125, due to the preferred manufacturing method of the invention, in this first embodiment, the reflective surface 330 is coated, on its side which is opposite to the substrate, with a fourth protective layer, such as a layer of aluminium nitride AlN, hafnium dioxide $HfO_2$ or sapphire $Al_2O_3$, capable of protecting the reflective surface 330 during an acid attack such as a hydrofluoric acid HF attack. The fourth protective layer 351 has a thickness of between 10 and 50 nm and preferably equal to 25 nm.

Such a detection structure 10 can be manufactured by means of a manufacturing method with three different phases:

- a first phase of manufacturing the main parts of the transistor 100, the steps corresponding to this first phase being illustrated in FIGS. 3A to 3L,
- a second phase of manufacturing the substrate including the read-out circuit 340, the steps corresponding to the second phase being illustrated in FIGS. 4A to 4F,
- a third phase of assembling the substrate 341 including the read-out circuit and transistor 100 and completing the detection structure 10, the steps corresponding to the third phase being illustrated in FIGS. 4G to 4S.

Figure 3A:
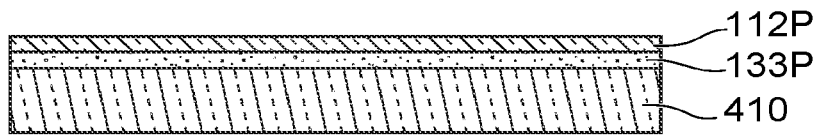
FIGS. 3A to 3M illustrate, by means of cross-sectional views, the preliminary steps of forming an intermediate substrate for forming a MOS-FET transistor of a detection structure as shown in FIG. 1, FIGS. 4A to 4T illustrate, by means of cross-sectional views, the steps of forming a control substrate, assembling said control substrate with the intermediate substrate shown in FIG. 3M and completing the detection structure shown in FIG. 1, FIGS. 5A to 5G illustrate, by means of cross-sectional views, the preliminary steps of forming an intermediate substrate for forming a MOS-FET transistor of a detection structure according to an alternative of the invention.
Figure 3B:
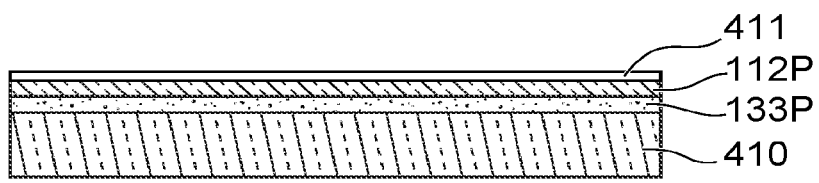
Figure 3C:
Figure 3D:
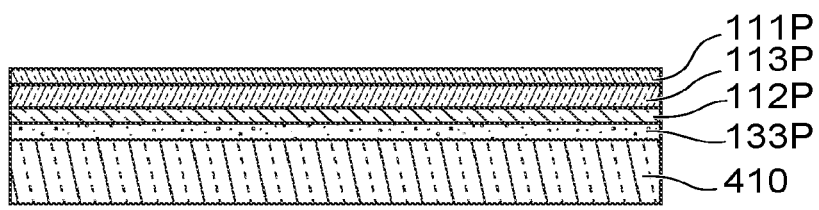
Figure 3E:
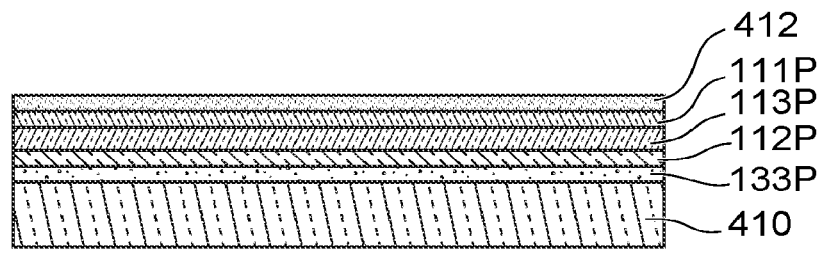
Figure 3F:
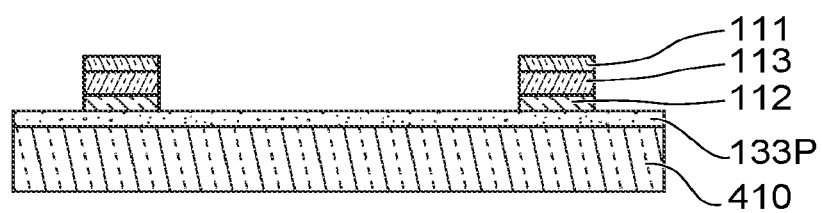
Figure 3G:
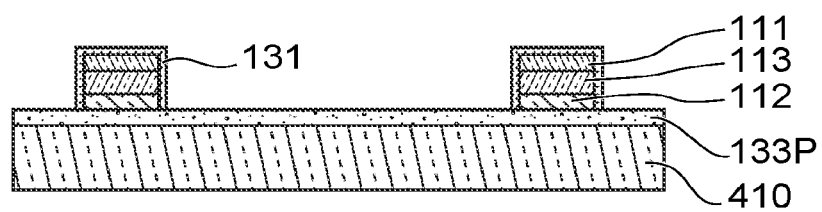
Figure 3H:
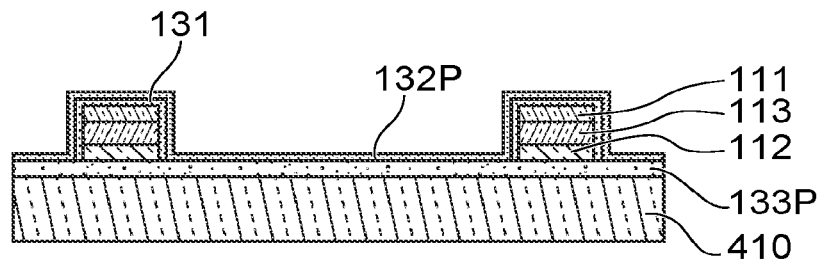
Figure 3I:
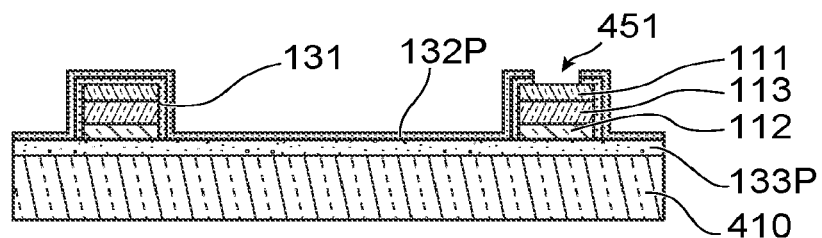
Figure 3J:
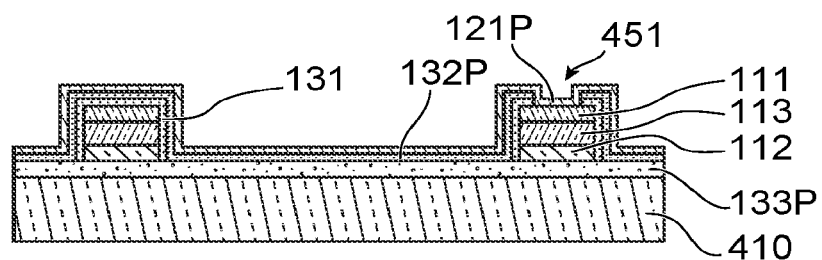
Figure 3K:
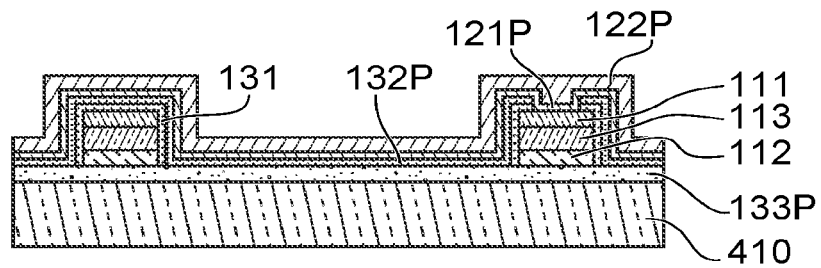
Figure 3L:
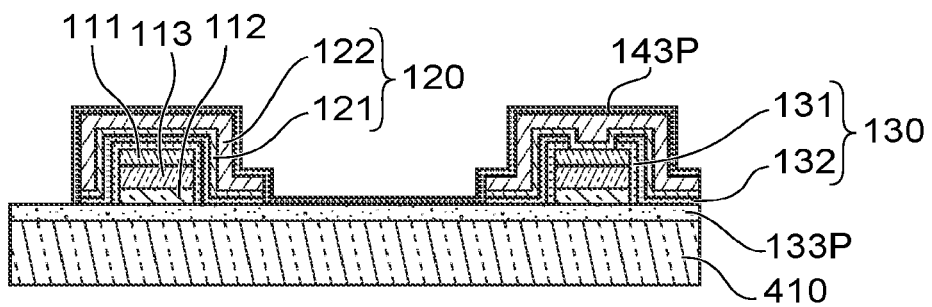
Figure 3M:
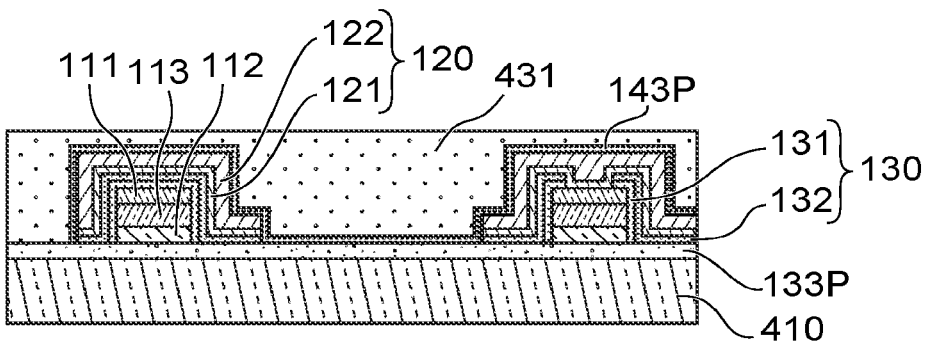

Thus, as illustrated in FIGS. 3A to L, the first phase of the manufacturing method comprises the following steps of:

- providing a first substrate 410 comprising a semiconductor on insulator layer, said layer forming the second layer 112P according to the invention and the insulator being formed by a third insulating layer 133P, such as a silicon-on-insulator (better known by the acronym SOI) substrate 133, as illustrated in FIG. 3A,
- partially oxidising the second layer 112P to form an oxide layer 411 and implanting, through said oxide layer 411, doping elements corresponding to the first conductivity type of the second layer 112P so as to provide the second layer 112P of detection structure 10, the doping element being phosphorus P in the case where the first conductivity type corresponds to P doping, and boron B in the case where the first conductivity type corresponds to N doping, as illustrated in FIG. 3B,
- withdrawing the oxide layer 411 formed upon oxidising the second layer 112P,
- epitaxially depositing a third layer 113P of semiconductor material in contact with the second layer 112P, the third layer 113P being of the second conductivity type opposite to the first conductivity type with a lower concentration of majority carriers than that of the second layer 112P, so as to provide the third layer 113P of detection structure 10, as illustrated in FIG. 3C,
- depositing a first layer 111P of semiconductor material in contact with the third layer 113P, as illustrated in FIG. 3D, the first layer 111P being of the first conductivity type, either by in situ doping during deposition or by post-deposition implantation, so as to provide the first layer 111P of detection structure 10, as illustrated in FIG. 3D,
- thermal annealing in order to activate the doping elements of the first and second layers 111P, 112P and, where applicable, the third layer 113P, as illustrated in FIG. 3E, it will be noted that in FIG. 3E the first layer 113P is coated with an implantation oxide layer 412 in accordance with the possibility that doping of the first layer 111P is provided by a post-deposition implantation,
- locally etching the stack formed by the first, third and second layers 111P, 113P, 112P in order to provide, in accordance with the present embodiment of the invention, a stack extending along a closed line, the first, second and third zones 111, 112, 113 thus being formed, as illustrated in FIG. 3F and in accordance with FIG. 2B,
- forming a thermal oxide in contact with the side walls and the face including the first zone of the stack of the first, second and third zones 111, 112, 113, so as to form the first insulating layer 131P, as illustrated in FIG. 3G,
- depositing a dielectric material having a higher dielectric coefficient than that of silicon dioxide $SiO_2$ in contact with the first insulating layer 131P so as to form the second insulating layer 132P, said first and second insulating layers 131P, 132P forming in particular the gate oxide 130, as illustrated in FIG. 3H,
- fitting at least one opening 451 in the first and second insulating layers 131P, 132P to release a zone from the first zone 111 and enable it to be electrically contacted, as illustrated in FIG. 3I,
- optionally implanting a doping element of the first conductivity type in the first zone 111 through opening 451 in order to promote contact making on said first zone 111,
- in the case where the first zone is of silicon, optional siliciding operation at the opening 451 to form a layer of a silicide selected from nickel silicide NiSi, titanium silicide TiSi, cobalt silicide CoSi and platinum silicide PtSi,
- depositing a first conductive material in contact with the second insulating layer 132P and the first zone 111 at the at least one opening 451 fitted in the first and second insulating layers 131A, 131B, so as to form the first conductive layer 121P, said first conductive material being for the present embodiment titanium nitride TiN with a thickness of between 5 and 15 nm, preferably equal to 10 nm, as illustrated in FIG. 3J,
- depositing a second conductive material in contact with the first conductive layer so as to form the second conductive layer 122P, said second conductive material being for the present embodiment polycrystalline silicon pSi of the first conductivity type deposited by chemical vapour deposition with a thickness of between 10 and 100 nm, preferably equal to 50 nm, as illustrated in FIG. 3K,
- depositing a first protective layer 143P such as a layer of aluminium nitride AlN, hafnium dioxide $HfO_2$ or sapphire $Al_2O_3$, capable of protecting said conductive layers during an acid attack such as a hydrofluoric acid HF attack, said protective layer having a thickness of between 10 and 50 nm and preferably equal to 25 nm, as illustrated in FIG. 3L,
- depositing a first sacrificial material, such as silicon dioxide $SiO_2$ in contact with the protective layer and planarising said sacrificial material to remove excess sacrificial material so as to encapsulate the first, second and third zones/first and second insulating layers/first and second conductive layers/protective layer assembly, whereby the main parts of transistor 100 have thus been formed and a first assembly to be assembled comprising the first substrate being formed, as illustrated in FIG. 3M.

Figure 4A:
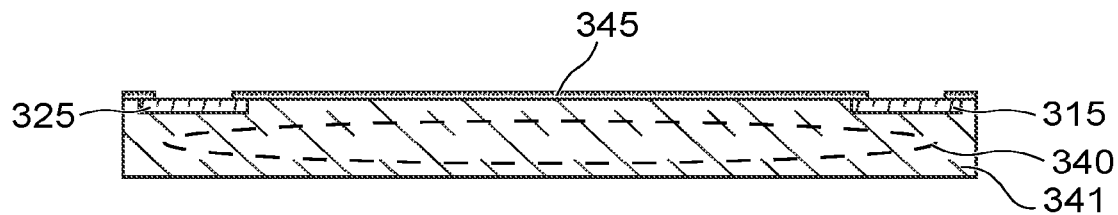
Figure 4B:
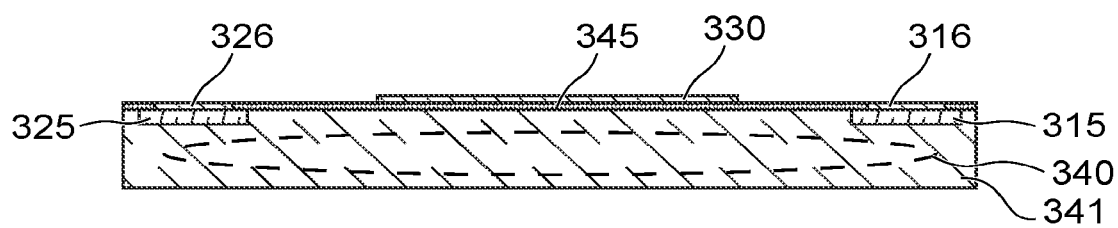
Figure 4C:
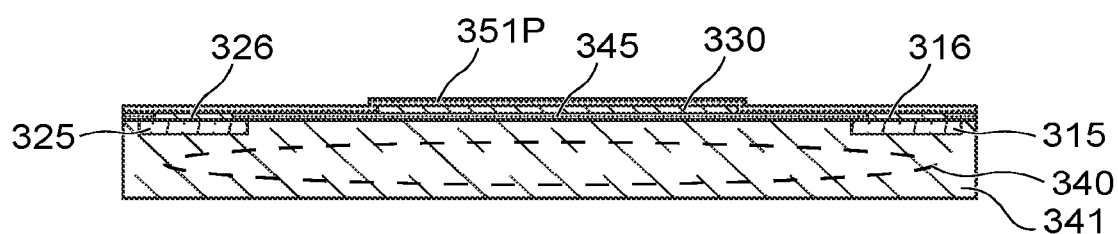
Figure 4D:
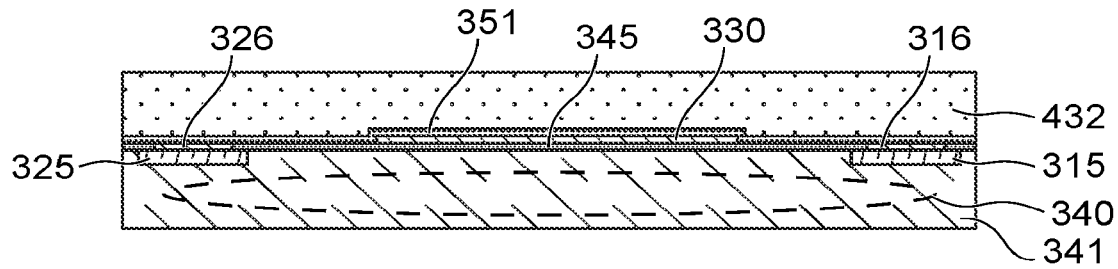
Figure 4E:
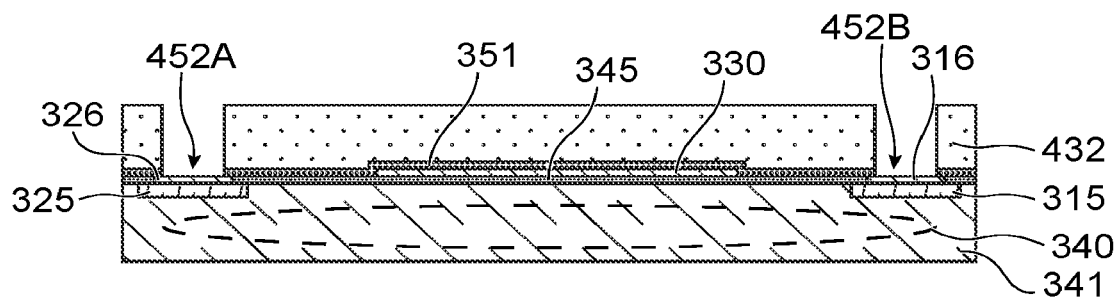
Figure 4F:
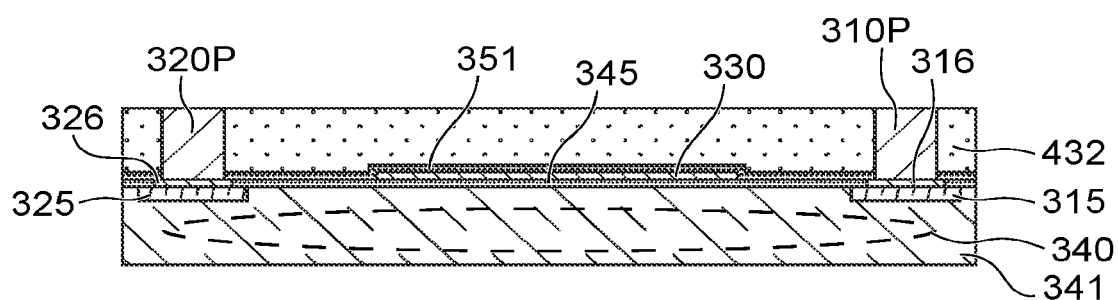
Figure 4G:
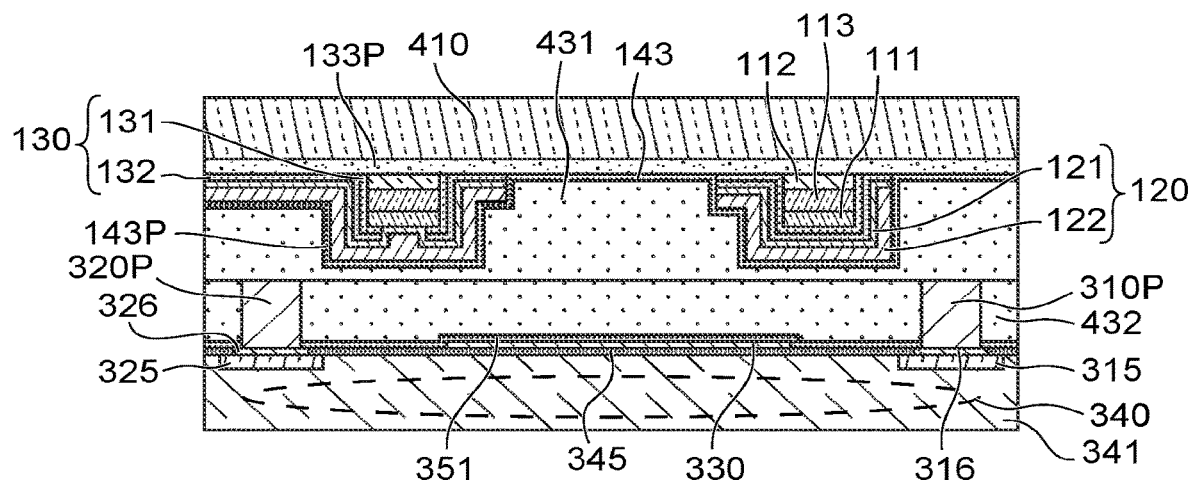
Figure 4H:
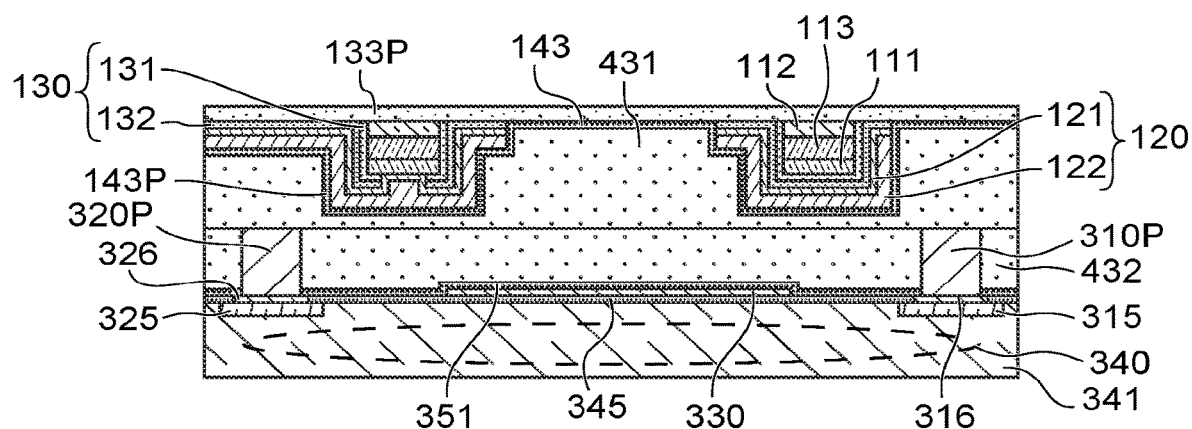
Figure 4I:
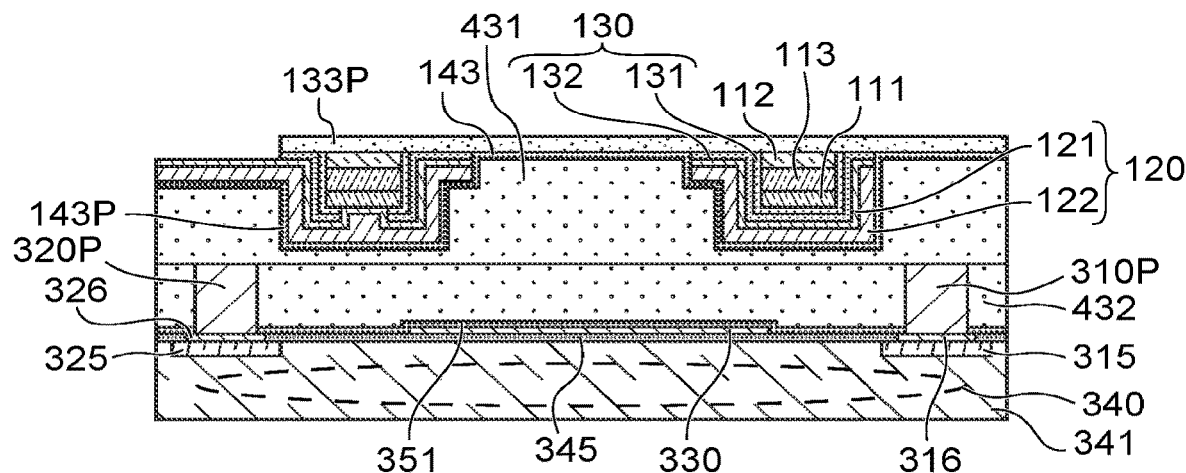
Figure 4J:
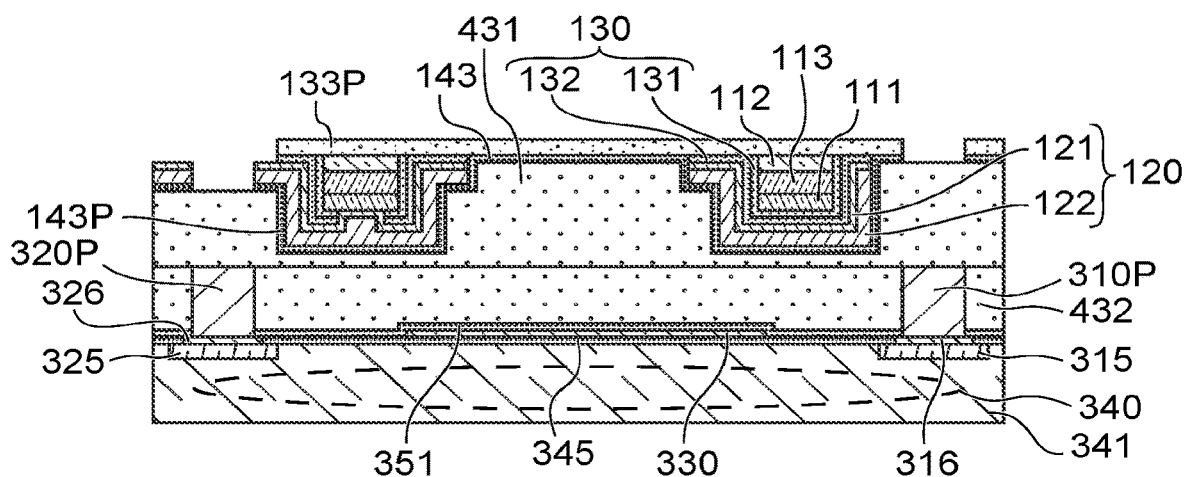
Figure 4K:
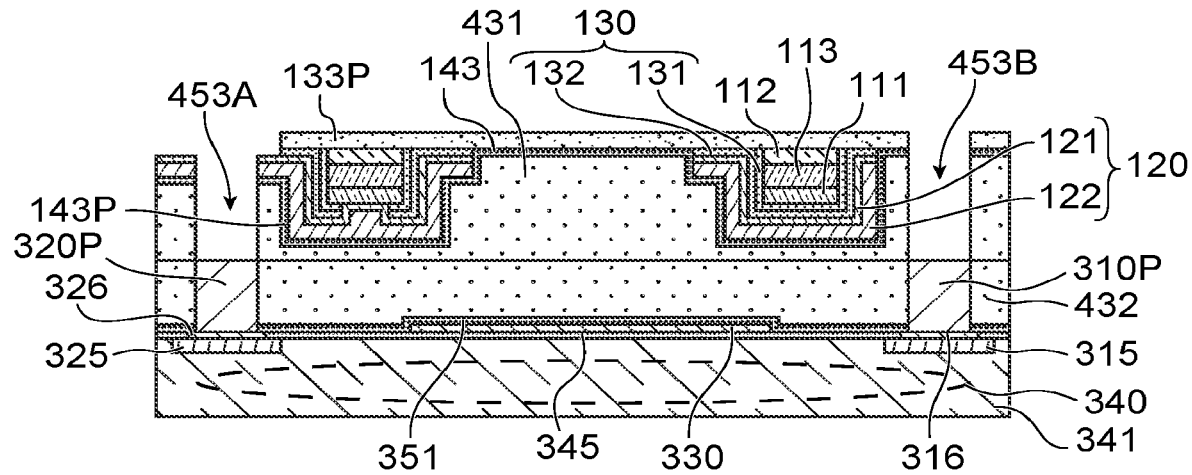
Figure 4L:
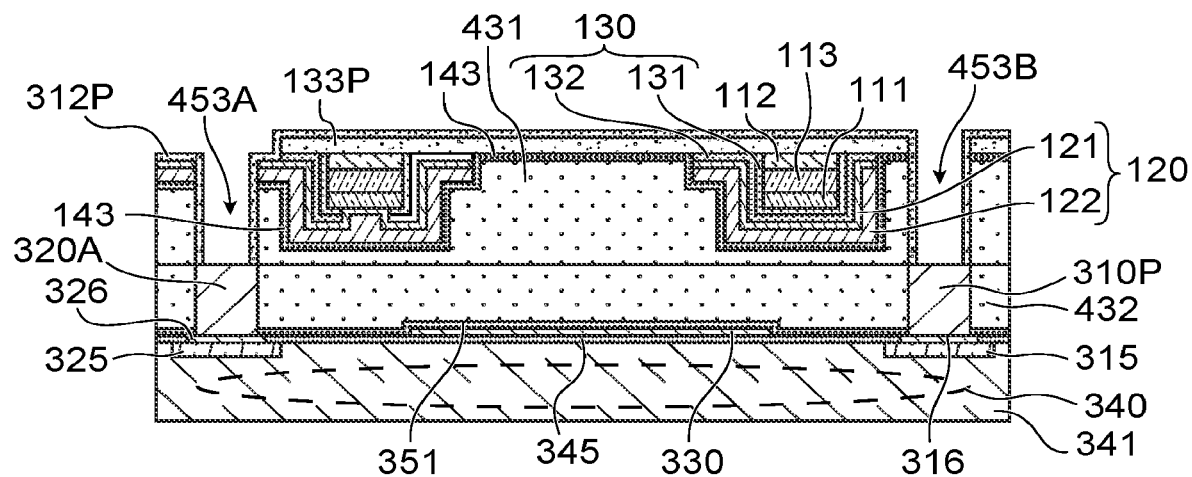
Figure 4M:
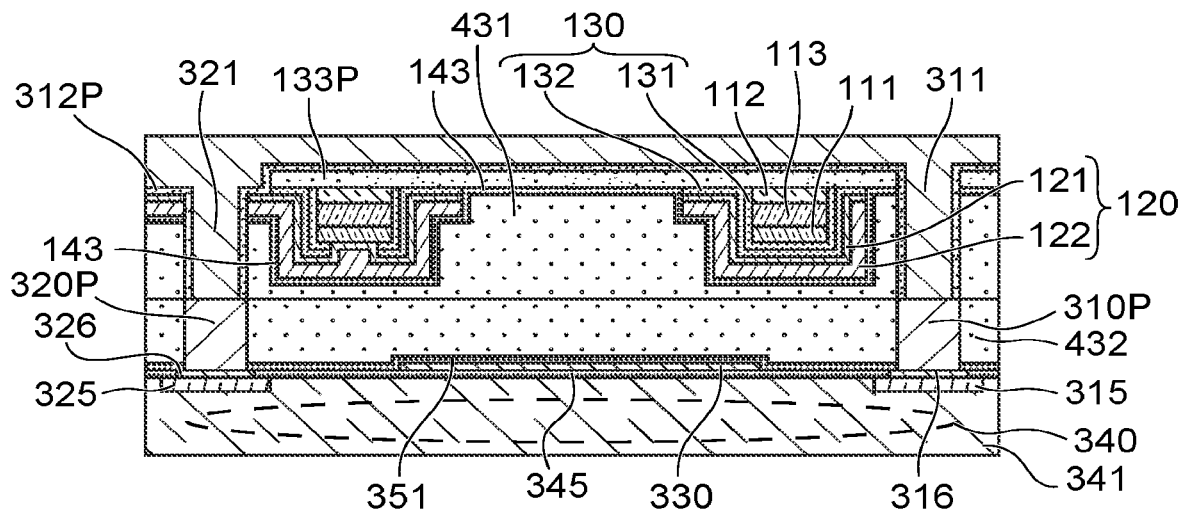
Figure 4N:
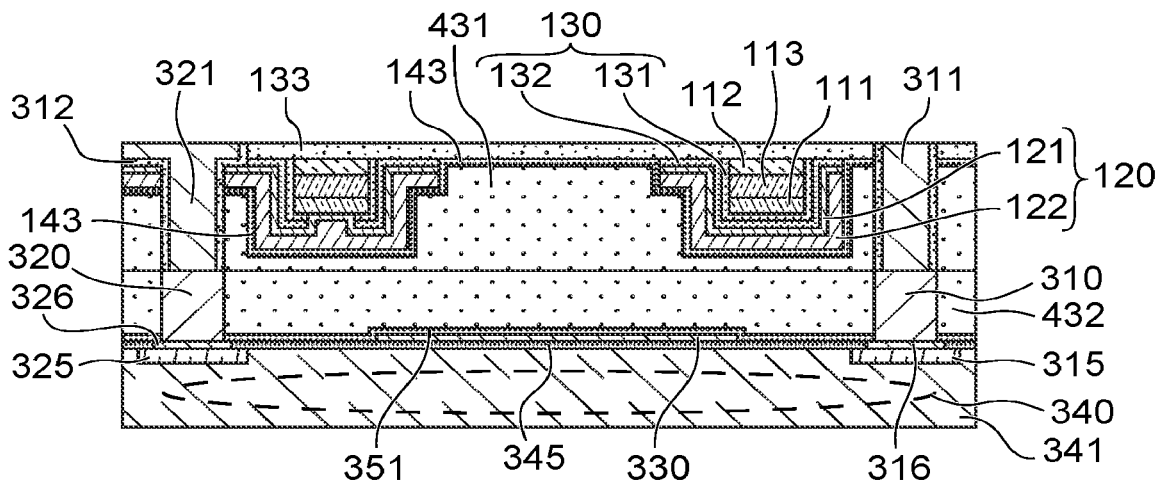
Figure 4O:
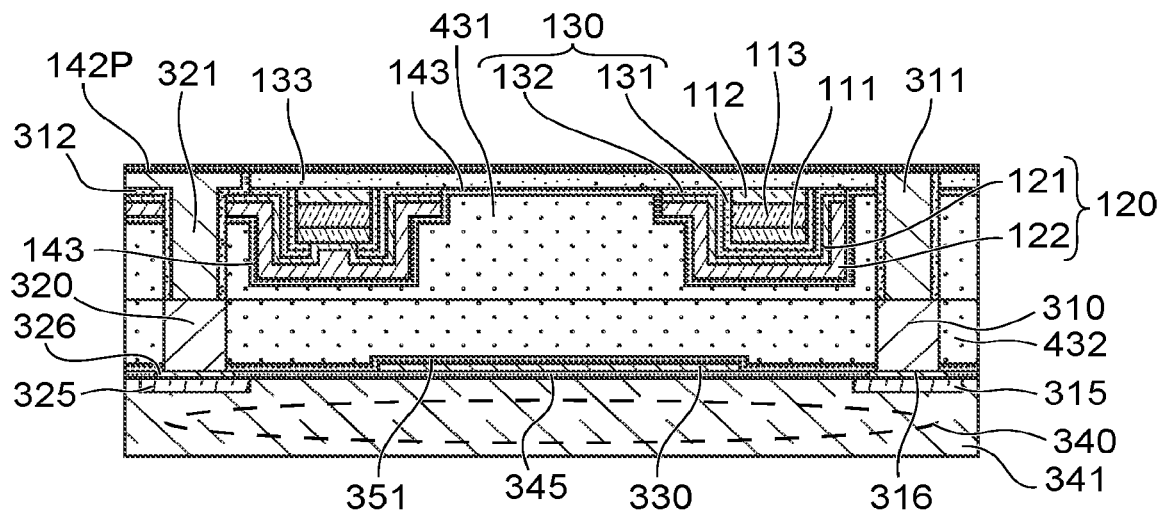
Figure 4P:
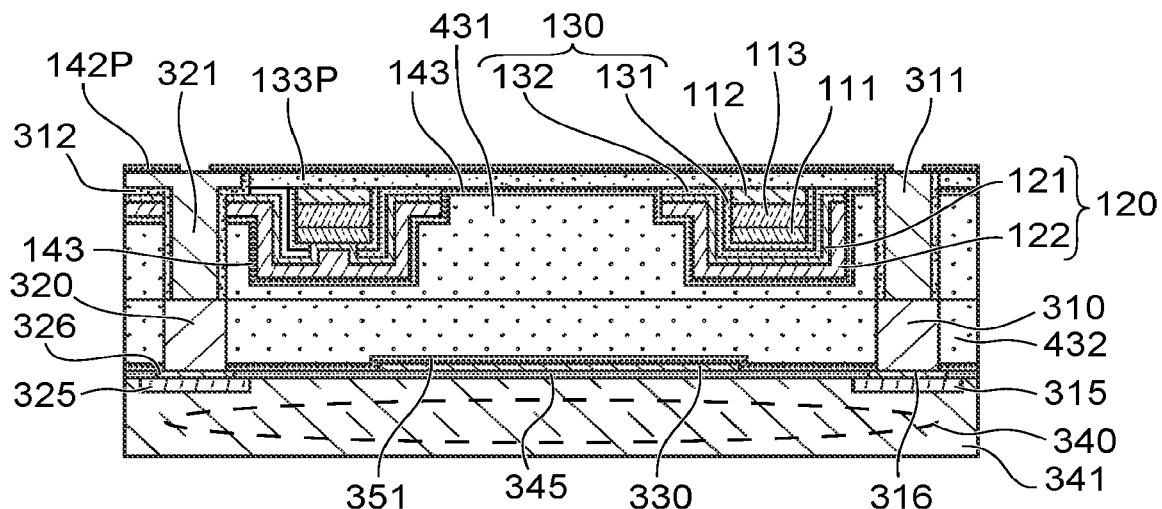
Figure 4Q:
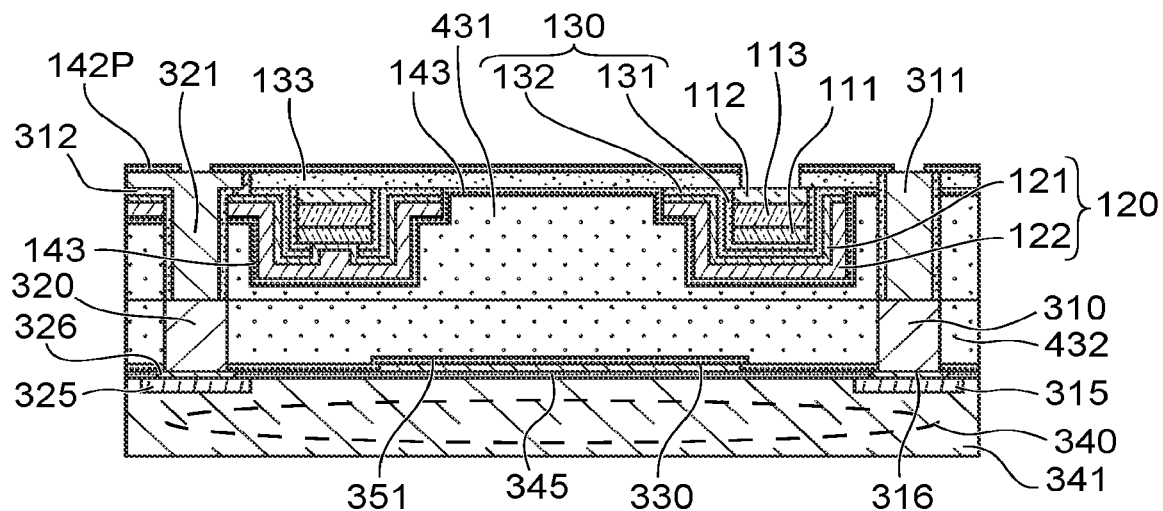
Figure 4R:
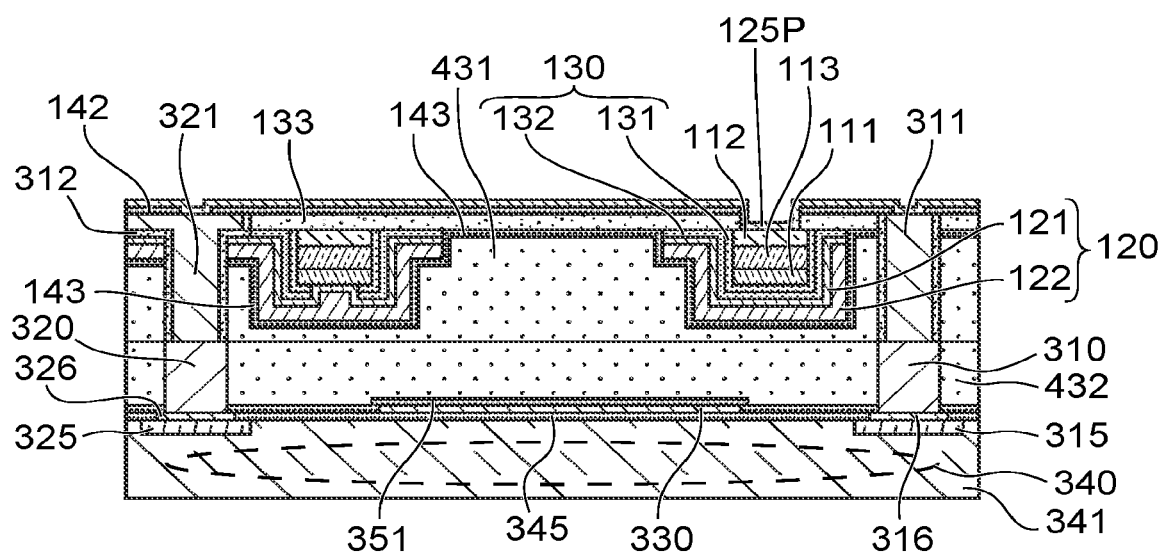
Figure 4S:
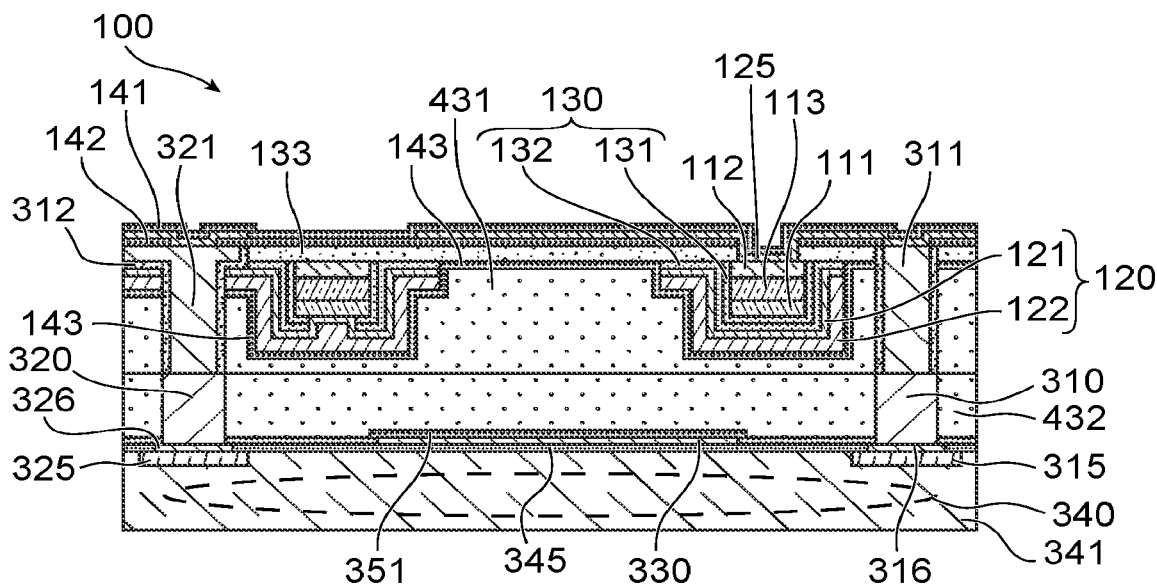
Figure 4T:
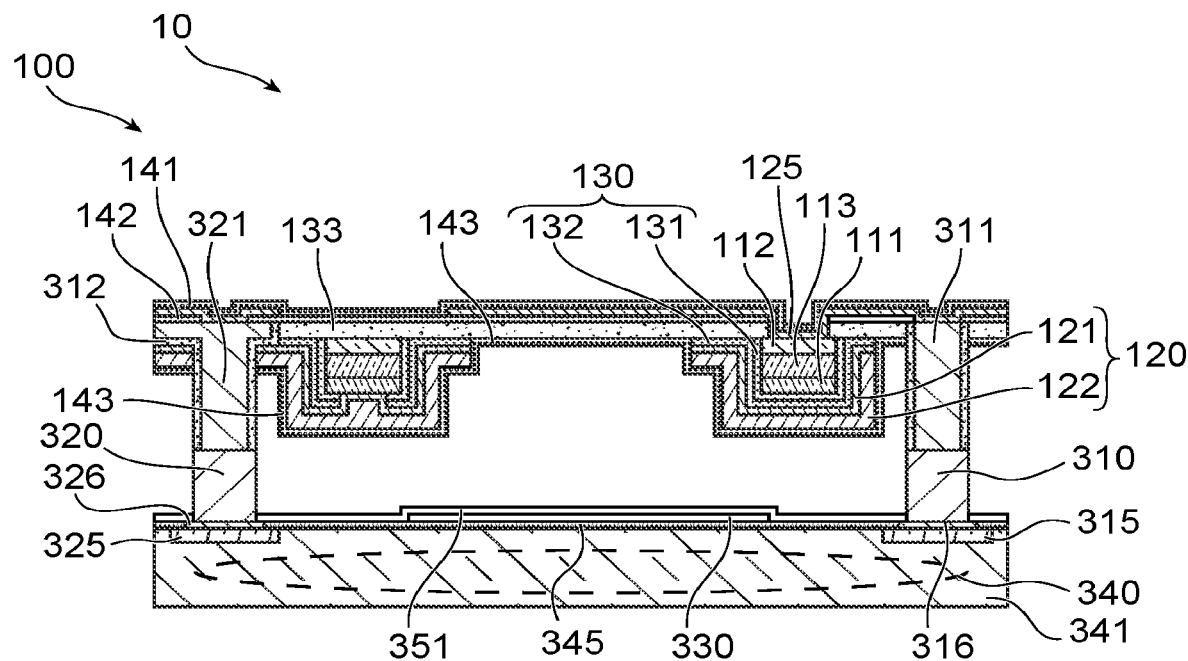

The second phase of the manufacturing method according to the invention may be implemented before, concomitantly with, or after the first phase described above. The second phase comprises the following steps of:

providing a second substrate 341, the second substrate 341 comprising a read-out circuit 340 and, on a first surface of the second substrate 341 having first and second contacts 325, 321 of the read-out circuit for connecting the gate electrode/first zone 111 and second zone 112 respectively, and a fourth insulating layer 345, preferably of silicon dioxide $SiO_2$, coating the part of the first surface of the second substrate 340 apart from the first and second contacts 325, 315 of the read-out circuit 341, said fourth insulating layer also covering the periphery of the first and second contacts 325, 315 of the read-out circuit 341, as illustrated in FIG. 4A, locally depositing a reflective conductive material in contact with the first and second contacts 325, 315 and on a part of the fourth insulating layer 345 to form a first and second contact pad 326, 316 and the reflective surface 330, the reflective conductive material, in this embodiment of the invention, being selected from the group including aluminium Al, copper Cu, gold Au, titanium Ti, platinum Pt, nickel Ni and alloys thereof, including especially copper-aluminium alloy with a thickness of between 100 nm and 1 μm, the latter preferably being equal to 300 nm, as illustrated in FIG. 4B, depositing a fourth protective layer 351 on the first substrate 340 in contact with the reflective surface 330, the first and second contact pads 326, 316 and that part of the fourth insulating layer 345 which is free of reflective conductive material, the fourth protective layer 351 being preferably selected from a layer of aluminium nitride AlN, hafnium dioxide $HfO_2$ or sapphire $Al_2O_3$, capable of protecting said conductive layer during an acid attack such as a hydrofluoric acid HF attack, said fourth protective layer 345 having a thickness of between 10 and 50 nm and preferably equal to 25 nm, as illustrated in FIG. 4C, depositing a second sacrificial material 432 such as silicon dioxide $SiO_2$ in contact with the fourth protective layer 351 and planarising said sacrificial material to remove excess second sacrificial material and provide a layer of the second sacrificial material between 1·3 and 2.5 μm as illustrated in FIG. 4D, forming first and second perforations 452A, 452B by locally etching the second sacrificial material layer 432 and the fourth protective layer 451 to release the first and second contact pads 326, 316 from the read-out circuit 341, as illustrated in FIG. 4E, filling the first and second perforations 452A, 452B with a metal material to form a first part 320P, 310P of the first and second insulation arms 320, 310 respectively, a second assembly to be assembled comprising the second substrate 340, the reflective conductive material, the second sacrificial material 432 and the first parts 310P, 320P of the first and second insulation arms 310, 320 being thus formed, as illustrated in FIG. 4F, bonding the first and second assemblies through their face comprising the first and second sacrificial materials 431, 432 respectively, as illustrated in FIG. 4G, removing the first substrate 410, as illustrated in FIG. 4H, locally etching the third insulator layer 133P revealed when removing the first substrate 410 and the first and second insulator layers 131, 132, the parts of the first, second and third insulator layers 131P, 132P, 133P removed during said etching being the parts facing the first part of the second thermal insulation arm 320, as illustrated in FIG. 4I, locally etching, on the one hand, a part of the first and second conductive layers 121P, 122P and the first protective layer 143 facing the first part of the second thermal insulation arm 320 and, on the other hand, a part of the third insulator layer 133 and the first protective layer 143 facing the first part of the first insulation arm 310, as illustrated in FIG. 4J, extending, by selective etching, said parts locally etched in the previous step in order to reach the first and second isolation arms and form third and fourth perforations 453A, 453B, as illustrated in FIG. 4K, depositing in the third and fourth perforations 453A, 453B and on the surface of the insulator layer, a first barrier layer 312P, for example of titanium nitride TiN or a titanium/titanium nitride Ti/TiN bilayer, said barrier layer having a thickness between 5 and 50 nm and preferably equal to 25 nm, as illustrated in FIG. 4L, filling the third and fourth perforations 453A, 453B with a second metal material to form a second part of the first and second insulation arms 310, 320 respectively and this in contact with the first part of the first and second insulation arms 310, 320 respectively so as to form the first and second insulation arms 310, 320 and the first and second conduction tracks 311, 321 as illustrated in FIG. 4M, polishing to remove excess second metal material and the portion of the first barrier layer 312P in contact with the surface of the third insulator layer 133P, as illustrated in FIG. 4N, depositing a second protective layer 142P in contact with the third insulator layer 133P and portions of the second parts of the first and second insulation arms 310, 320 which are flush with said third insulator layer 133P, the second protective layer 142P being preferably selected from a layer of aluminium nitride AlN, hafnium dioxide $HfO_2$ or sapphire $Al_2O_3$, capable of protecting said third insulator layer 133P and said portions of the second parts of the first and second insulation arms 310, 320 during an acid attack such as hydrofluoric acid HF attack, said second protective layer 142P having a thickness of between 10 and 50 nm and preferably equal to 25 nm, as illustrated in FIG. 4O, locally etching the second protective layer 142P facing the first and second insulation arms 310, 320, as illustrated in FIG. 4P, locally etching the second protective layer 142P and the third insulator layer 133P facing the second zone 112, the third protective layer 142 and the third insulator layer 133 being thus formed, as illustrated in FIG. 4Q, depositing a third conductive material 125P in contact with the third protective layer 142 and the parts of the second zone 112, the first and second free arms of the second protective layer to form a third conductive layer 125P, the third conductive layer 125P being in contact with the second zone 112 and with each of the first and second conduction tracks 311, 321, as illustrated in FIG. 4R, locally etching the third conductive layer 125P in order to electrically insulate the first conduction track 320 from the second conduction track 311, thereby releasing part of the third protective layer 142 and forming the third conductive layer 125, depositing a first protective layer 141 in contact with the third conductive layer 125 and the part of the third protective layer free of the layer of the third conductive material, as illustrated in FIG. 4S, selectively attacking the first and second sacrificial materials 431, 432 to release the first and second isolation arms 310, 320 and thus form the detection structure 10, as illustrated in FIG. 4T.

Figure 5A:
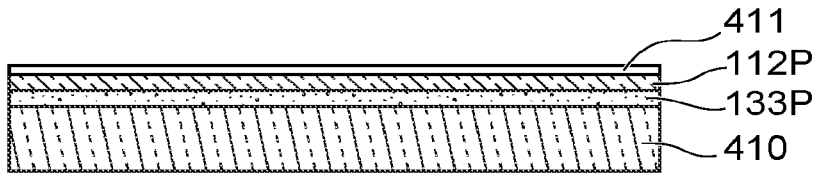
Figure 5B:
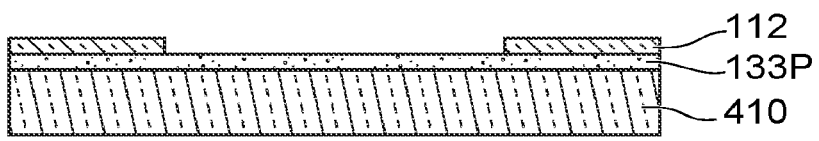
Figure 5C:
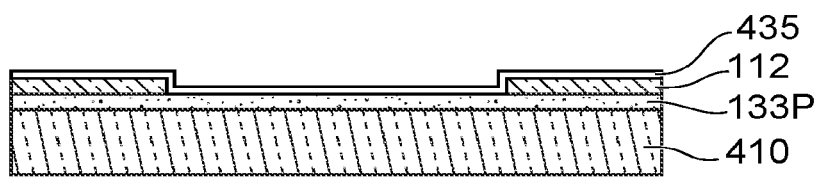
Figure 5D:
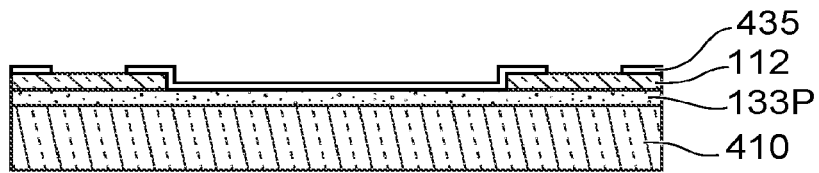
Figure 5E:
Figure 5F:
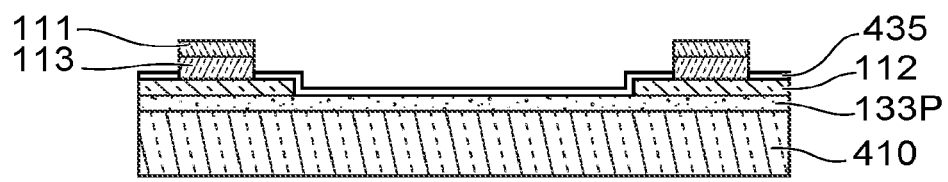
Figure 5G:
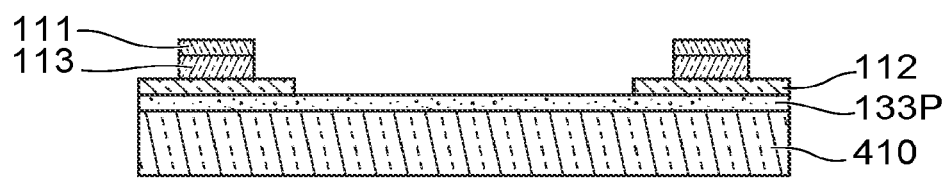

According to another possibility of the invention, the first to third zones 111, 112, 113 may not have identical side dimensions, for example the second zone 112 may have for example a greater width than the first and third zones 111, 113 as illustrated in FIG. 5G.

If a detection structure according to this other possibility of the invention only differs in the side dimensions of said second zone 112, in the method for manufacturing a detection structure 113 according to this other possibility is differentiated in that during the first phase of manufacturing the main parts of transistor 100, the steps between the oxidation step to form an oxide layer 411 in FIG. 3B and implantation and the step of locally etching the stack formed in FIG. 3F are replaced by the following steps, illustrated in FIGS. 5A to 5G, of:
- oxidising to form an oxide layer 411 and implanting, through said oxide layer 411, doping elements corresponding to the first conductivity type of the second layer 112P so as to provide the second layer 112P of the detection structure 10, the doping element being phosphorus P in the case where the first conductivity type corresponds to P-doping, and boron B in the case where the first conductivity type corresponds to N-doping, identically to the step in FIG. 3B and as illustrated in FIG. 5A,
- locally etching the second layer 112P to form the second zone 112, as illustrated in FIG. 5B,
- depositing a layer 435 of material selected from an oxide such as silicon dioxide, or a nitride, such as silicon nitride SiN, in contact with the second layer 112P and the third insulator layer 133P, said layer 435 having a thickness between 10 and 100 nm, as illustrated in FIG. 5C,
- locally etching layer 435 so as to release a part of the second layer 112P corresponding to the third zone 113, as illustrated in FIG. 5D,
- selectively depositing the third layer 113P in contact with the part of the second layer 112P free of layer 435 so as to form the third zone 113, the third layer 113P being of the second conductivity type opposite to the first conductivity type with a lower concentration of majority carriers than the second layer 112P, so as to provide the third layer 113P of detection structure 10, as illustrated in FIG. 5E,
- selectively depositing the first layer 111P of semiconductor material in contact with the third layer 113P, the first layer 111P being of the first conductivity type, either by in situ doping during deposition or by post-deposition implantation, so as to provide the first layer 111P of detection structure 10, as illustrated in FIG. 5F,
- removing layer 435, as illustrated in FIG. 5G.

According to a third embodiment of the invention, not illustrated, the first conductive layer 121 can extend along the detection zone and define, for the part of the first conductive layer 121 extending along the detection zone, the absorption plane. It will be noted that by "extending along the detection zone" it is meant that the part of the first conductive layer 121 extends parallel to, and near, the detection zone.

Thus, a detection structure 1 in this third embodiment is differentiated from a detection structure 1 in the first embodiment in that:
- it is the first conductive layer 121 which defines, for at least its part extending along the detection zone, the absorption plane, the quarter-wave cavity 350 thus being formed between the first semiconductor layer 121 and the reflective surface 330,
- the third conductive layer 125 does not extend along the detection zone.

A method for manufacturing a detection structure 1 according to this third embodiment is differentiated from a method for manufacturing a detection structure only in that during the steps of locally etching the third conductive layer 125P and the first conductive layer 121P, the part extending along the detection zone is kept for the first conductive layer 121P and etched for the third conductive layer 125P.

In an alternative to this third embodiment, the third conductive layer 125 can also extend along the detection zone. According to this alternative, one of the first and second conductive zones defines the absorption plane, the other providing additional absorption to the detection structure according to the same principle described in the first embodiment in which the second conductive layer 121 of the gate electrode provides an absorbing element complementary to the absorbing element formed by the third conductive layer 125.

Of course, the first, second and third embodiments described above are provided only by way of examples and illustrate a configuration of the invention corresponding to a particular application thereof. Thus, for example, if in these two embodiments, the first conductive layer 121 is made of a "mid-gap" metal, it is contemplatable, without departing from the scope of the invention, that the first conductive layer 121 may be formed of a conductive material other than a "mid-gap" metal.

The invention claimed is:

1. A detection structure of the bolometer type for detecting an electromagnetic radiation, the detection structure including:
   - at least one absorbing element configured to absorb the electromagnetic radiation, said absorbing element defining an absorption plane,
   - a transistor of MOS-FET type associated with the absorbing element to detect temperature rise of said absorbing element upon absorbing the electromagnetic radiation by the absorbing element, the transistor including:
     - at least one first and one second zone of a first conductivity type,
     - at least one third zone separating the first and second zones from each other, the third zone being of a second conductivity type opposite to the first conductivity type and having a lower concentration of majority carriers than that of the first and second zones,
     - a gate electrode,
   - wherein the first zone, the third zone, and the second zone are formed by a first layer, a third layer, and a second layer respectively, each of the first layer, the second layer, and the third layer extending parallel to the absorption plane, the first layer, the third layer, and the second layer following one another relative to a direction perpendicular to said absorption plane, each of the first zone, the second zone, and the third zone having, along the direction perpendicular to said absorption plane, at least one side wall,
   - and wherein the gate electrode covers the third zone along at least one side wall of the third zone.

2. The detection structure according to claim 1, wherein the third zone has at least two side walls, the gate electrode covering the third zone along at least two side walls of the third zone which are opposite to each other.

3. The detection structure according to claim 1, wherein the absorbing element comprises an absorption portion extending beyond a stack formed by the first zone, the third zone and the second zone.

4. The detection structure according to claim 3, wherein the stack formed by the first zone, third zone, and second zone at least partly surrounds a detection zone of the detection structure, the absorption portion extending at least partly along said detection zone.

5. The detection structure according to claim 1, wherein the gate electrode comprises the absorbing element.

6. The detection structure according to claim 5, wherein the absorbing element of the at least one absorbing element comprises at least one layer made of a "mid-gap" metal for the third zone.

7. The detection structure according to claim 1, wherein the transistor further includes a metal contact for the second zone.

8. The detection structure according to claim 7, wherein the metal contact of the second zone includes the absorbing element.

9. The detection structure according to claim 1, wherein the absorbing element comprises a conductive layer supported by at least one insulating layer, a metal of the conductive layer and thicknesses of the conductive layer and of the at least one insulating layer supporting it being selected so as to meet the following inequalities:

$$150 \, \Omega \le \frac{\rho}{Ep} \le 700 \, \Omega$$

with $\rho$ an equivalent resistivity of said layers and $Ep$ a sum of the thicknesses of said layers.

10. The detection structure according to claim 1, wherein the gate electrode covers the first zone and forms a metal contact of the first zone.

11. A method for manufacturing a detection structure of the bolometer type for detecting an electromagnetic radiation, the manufacturing method comprising:
   providing a second zone of a first conductivity type, said second zone extending along an absorption plane,
   forming a third zone in contact with the second zone, the second zone being of a second conductivity type opposite to the first conductivity type with a lower concentration of majority carriers than that of the second zone,
   forming a first zone in contact with the third zone, the first zone being of the first conductivity type with a higher concentration of majority carriers than that of the third zone, so that each of the first zone, the second zone, and the third zone extends parallel to an absorption plane and that the first zone, the third zone, and the second zone follow one another along a direction perpendicular to said absorption plane, each of the first zone, the second zone, and the third zone having, along the direction perpendicular to said absorption plane, at least one side wall,
   forming a gate electrode covering the third zone along at least one side wall of said third zone so as to form a MOS-FET transistor comprising the first zone, the second zone, and the third zone and the gate electrode,
   the manufacturing method further comprising forming an absorbing element associated with the transistor so that that the transistor is configured to detect a temperature rise of said absorbing element upon absorbing the electromagnetic radiation, said absorbing element defining the absorption plane.

12. The manufacturing method according to claim 11, wherein the steps of providing and forming the first, second and third zones are concomitant, said providing and forming steps being performed by etching a stack comprising a second, a third, and a first layer.

13. The manufacturing method according to claim 11, wherein the second zone is provided prior to forming the third and first zones, the third zone being formed by selective deposition on at least one portion of the second zone and the first zone being formed by selective deposition on at least one portion of the third zone.

* * * * *